United States Patent [19]

Puretz et al.

[11] Patent Number: 4,698,129
[45] Date of Patent: Oct. 6, 1987

[54] FOCUSED ION BEAM MICROMACHINING OF OPTICAL SURFACES IN MATERIALS

[75] Inventors: Joseph Puretz, Beaverton; Jonathan H. Orloff, Portland; Richard K. DeFreez, Hillsboro; Richard A. Elliott, Beaverton, all of Oreg.

[73] Assignee: Oregon Graduate Center, Beaverton, Oreg.

[21] Appl. No.: 858,357

[22] Filed: May 1, 1986

[51] Int. Cl.[4] .................... H01L 21/306; B44C 1/22; C03C 15/00; C03C 25/06
[52] U.S. Cl. .................... 156/643; 156/655; 156/662; 156/903; 204/192.34; 437/20
[58] Field of Search .............. 156/643, 655, 662, 903; 204/192 EC, 192 E, 192.34; 29/569 L, 580; 219/121 EJ, 121 EK, 121 LH, 121 LJ, 121 LK; 350/96.11, 629; 357/17, 30, 31

[56] References Cited

U.S. PATENT DOCUMENTS

| | | | |
|---|---|---|---|
| 3,988,564 | 10/1976 | Garvin et al. | 219/121 EM |
| 4,075,452 | 2/1978 | Simon | 219/121 EM |
| 4,128,467 | 12/1978 | Fischer | 204/192 E |
| 4,169,009 | 9/1979 | Wagner | 156/636 |
| 4,275,286 | 6/1981 | Hackett | 219/121 EK |
| 4,389,275 | 6/1983 | Ballato | 156/626 |
| 4,426,582 | 1/1984 | Orloff | 250/396 ML |
| 4,457,803 | 7/1984 | Takigawa | 156/626 |

Primary Examiner—William A. Powell
Attorney, Agent, or Firm—Kolisch, Hartwell & Dickinson

[57] ABSTRACT

A method of forming one or more optical surfaces of the designer's choice in a body of material. The method includes the steps of exposing in a work zone a selected face in a body of selected material, directing a focused ion beam in a predetermined manner into the work zone to impinge the selected face, and by such directing and impinging, removing material from the body to create the desired optical surface(s). Preferably, beam direction is accomplished under the control of a suitably programmed computer.

4 Claims, 3 Drawing Figures

FOCUSED ION BEAM MICROMACHINING OF OPTICAL SURFACES IN MATERIALS

BACKGROUND AND SUMMARY OF THE INVENTION

This invention relates to a method for making one or more operative, optical surfaces to form part or parts of optical devices in a body of material. For the purpose of illustration herein, preferred manners of practicing the invention are described in conjunction with the making of semiconductor diode lasers, a field wherein the steps of the invention offer significant utility.

At the present time, substantially all commercially available semiconductor diode lasers are created by cleaving dice from wafers of optical semiconductor material, with the cleaved facets serving as the operative laser mirrors (optical surfaces). Many other processes have been proposed in the past for preparing such mirrors, including wet chemical etching, reactive ion etching (dry etching), and chemical etching with subsequent mass-transport. All of these prior techniques present certain difficulties which those skilled in the art would like to avoid. For example, some involve complex photolithographic masking procedures where masking or related errors can result in a poor yield of devices. Such poor-yield characteristics substantially rule out these procedures for the making of a monolithic multiple-device integrated unit. Lasers prepared by cleaving do not lend themselves, practically, to the coupling of such lasers to create complex monolithic topographies.

Accordingly, a general object of the present invention is to provide a new and very effective technique for preparing optical surfaces, such as mirror facets, in optical devices, such as semiconductor lasers, which avoids the problems that shadow many prior art techniques.

More particularly, an object of the invention is to provide a novel procedure which avoids completely complex steps, such as photolithographic masking steps, and which also permits the simple formation of complex monolithic architectures.

According to a preferred manner of practicing the invention with regard to semiconductor material, a wafer of optical semiconductor material is positioned so that a selected face in the wafer is disposed appropriately in a predetermined work zone. Such accomplished, a focused ion beam is directed in a selected manner, typically under the control of a computer, to impinge the selected face in the wafer thereby to remove material to create the desired optical surface.

By employing this same technique through plural selected directions of such an ion beam, plural optical devices, which couple appropriately with one another in a complex architecture, can easily be laid out monolithically on a single, unitary wafer.

These and other objects and advantages which are attained by the invention will become more fully apparent as the description which now follows is read in conjunction with the accompanying drawings.

DETAILED DESCRIPTION OF THE INVENTION

Figure 1:
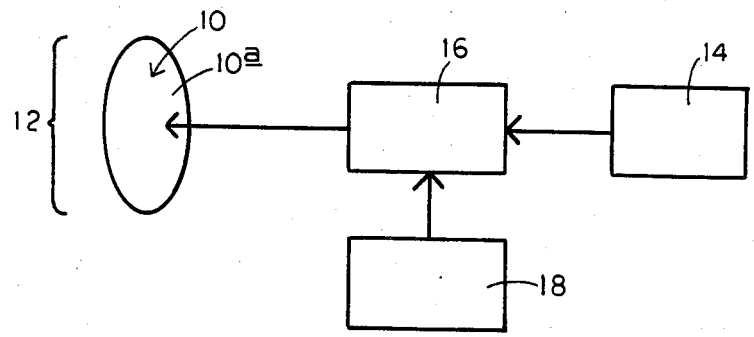
FIG. 1 is a simplified schematic view illustrating the practice of the present invention to form an optical surface in a wafer of optical semiconductor material.

Turning attention now to the drawings, and referring first of all to FIG. 1, at 10 is shown a conventional and commercially available, thin-film wafer of optical semiconductor material. This material is of the type typically used for the production of optical semiconductor devices, such as diode lasers and various control devices therefor. Wafer 10 in FIG. 1 has been placed in what is referred to herein as a work zone, indicated by the bracket at 12.

Shown at 14 in block form is a focused source of gallium ions whose beam, according to the practice of the present invention, is directed through a conventional beam deflection system 16 which is operated under the control of a suitably programmed digital computer shown at 18. As will be appreciated by those skilled in the art, wafer 10, source 14 and system 16 are located in a vacuum environment, preferably with a pressure of $10^{-6}$-Torr or lower.

According to a preferred manner of practicing the invention, and describing the steps thereof in general terms, these include: exposing a selected face, such as face 10a, in wafer 10, in a work zone, such as zone 12; directing a focused ion beam, as from source 14, into the work zone to impinge the exposed face, with directing occurring through the operation of a deflection system like system 16; and, by such directing and impinging, removing material from the wafer thus to create the desired optical surface, such as a mirror facet for a laser. As will be apparent to those skilled in the art, computer 18 is readily programmable in any manner desired by the practicer of this invention to produce an infinite variety of patterns over the entire exposed face of a wafer, thus to be able to create, if so desired, extremely complex, monolithic topographies or architectures.

Explaining, by way of a more detailed illustration, a typical operation performed in accordance with the invention, this will be discussed, with FIG. 2 now taken into account along with FIG. 1. As was mentioned earlier, wafer 10 is a conventional and commercially available wafer and, as viewed in FIG. 2, it includes an upper metallization surface layer 10b which defines previously mentioned face 10a, and a lower metallization surface layer 10c. Disposed between these metallization layers, and ascending through the wafer from layer 10c, is the basic substrate layer 10d, a cladding layer 10e, the so-called active layer 10f, and another cladding layer 10g. Typically, active layer 10f has a thickness of about 0.15-micrometers, with its central plane lying about 4-micrometers below surface 10a. Such is the case in wafer 10.

Figure 2:
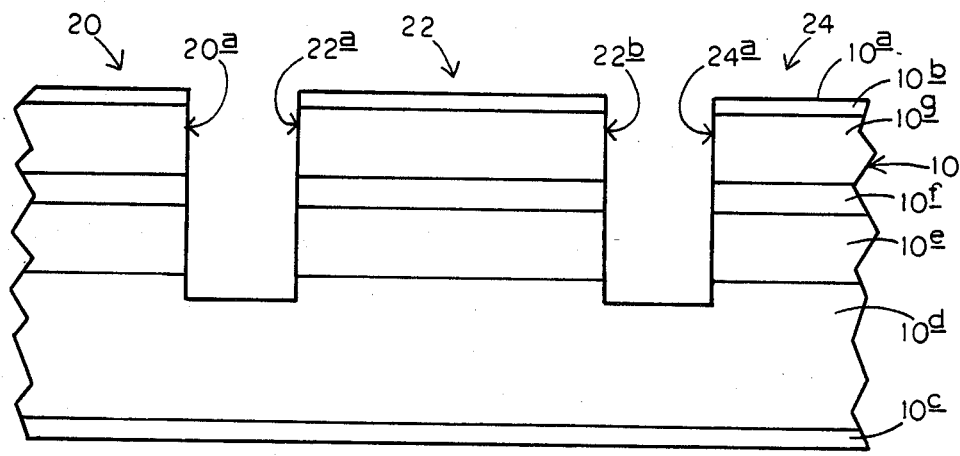
FIG. 2 is an enlarged, fragmentary section through a wafer, like that shown in FIG. 1, illustrating optical surfaces that have been formed therein to produce a family of three coupled and unified optical semiconductor devices.

FIG. 2 illustrates the result of a micromachining procedure performed in accordance with the steps of the present invention to create three optical devices shown generally at 20, 22, 24. In the particular structure illustrated in FIG. 2, device 20 is intended ultimately to operate as a laser, device 22 as a control element, and device 24 as a laser. The reader should note that devices 20, 24 have been shown herein only fragmentarily.

The right side of device 20 terminates with an optical surface 20a formed in accordance with the invention. Device 22 terminates with optical surfaces 22a, 22b, also formed in accordance with the invention. The left side of device 24 in FIG. 2 terminates with an optical surface 24a constructed in accordance with the invention. Each of these surfaces was formed to a depth of approximately 8-micrometers using a 20 keV Ga+ ion beam of $3 \times 10^{-10}$-ampere current focused into a 0.25-micrometer diameter spot, and directed by system 16 under the appropriate control of computer 18. Monitoring of the progress of each of the micromachining steps required to remove material from the wafer thus to create these optical surfaces was performed by imaging with secondary electrons.

Pausing for a moment to reflect on the significance of what has just been described, it is obvious that the making of an optical surface in an optical semiconductor material through practicing the steps of the invention avoids all photolithography masking steps, and clearly lends itself to the making of complex monolithic architectures which may be distributed over substantially the entire face of a wafer.

Figure 3:
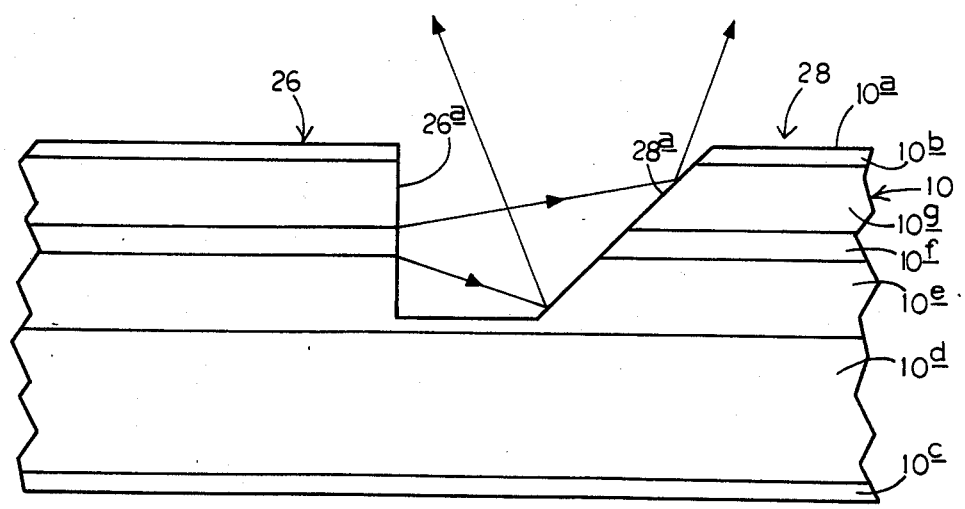
FIG. 3 is a fragmentary, sectional view like FIG. 2 illustrating practice of the invention to form optical surfaces that create a surface-emitting diode laser.

FIG. 3 is included to illustrate another pair of devices created through practicing the steps of the invention with a pair of confronting optically-coupled surfaces that have been formed, in one case, to have a different shape and orientation as compared with the optical surfaces illustrated in FIG. 2.

In order to simplify the nomenclature, it is assumed that the structure shown in this figure has also been prepared in wafer 10, and so, reference numerals which are like those used in FIG. 2 have been used for corresponding portions of FIG. 3.

Two devices, shown at 26, 28, coupled through optical surfaces 26a, 28a, respectively, formed in accordance with the invention, have been prepared in wafer 10. Device 26 is intended to operate as a laser, and device 28 as power monitor. Optical surface 26a is substantially the same as those described in connection with FIG. 2. Surface 28a has been formed at an oblique angle for the purpose of permitting not only light-coupling between devices 26, 28 but also surface emission of light upwardly in the figure.

It should be apparent now to those skilled in the art that a wide variety of optical surfaces, including curved surfaces where desired, can be formed employing the steps of the present invention to create both simple and complex architectures in a single wafer of optical semiconductor material. Accordingly, it should be understood how the steps proposed by the invention lead to an avoidance of the difficulties encountered with prior art techniques and, as a consequence, fully meet the objectives of the invention.

As was mentioned earlier, an example of practising this invention has been given in conjunction with the creation of optical surfaces and optical semiconductor material. Those skilled in the art will recognize, however, that there are many other kinds of materials wherein optical surfaces may be created, and the steps of the present invention are clearly usable with such other materials.

While a preferred manner of practicing the invention has been described herein, it is appreciated that variations and modifications may be made without departing from the spirit of the invention.

It is claimed and desired to be secured by Letters Patent:

1. A method of preparing, in a body of material, an optical surface to form part of an optical device, said method comprising
    exposing a selected face in such a body in a predetermined work zone,
    directing a focused ion beam in a selected manner into such work zone to impinge the selected face in the body, and
    by said directing and impinging, removing material from the body thus to create the desired optical surface, which surface intersects the selected face in the body in a desired manner.

2. The method of claim 1, wherein said directing is effected under the control of a programmed computer.

3. A method of preparing, in a body of material, at least a pair of optically coupled optical surfaces which form portions of a pair of optical devices, said method comprising
    exposing a selected face in such a body in a predetermined work zone,
    directing a focused ion beam in a selected manner into such work zone to impinge the selected face in the body, and
    by said directing and impinging, removing material from the body, thus to create the desired pair of optically coupled optical surfaces, which surfaces intersect the selected face in the body in a desired manner.

4. The method of claim 3, wherein said directing is effected under the control of a programmed computer.

* * * * *